United States Patent
Le Naour et al.

(10) Patent No.: US 7,436,250 B2
(45) Date of Patent: Oct. 14, 2008

(54) HIGHLY SELECTIVE FILTERING DEVICE AND CORRESPONDING FILTERING METHOD

(75) Inventors: Jean-Yves Le Naour, Pace (FR); Jean-Luc Robert, Betton (FR); Olivier Mocquard, Rennes (FR)

(73) Assignee: Thomson Licensing, Boulogne Billancourt (FR)

( * ) Notice: Subject to any disclaimer, the term of this patent is extended or adjusted under 35 U.S.C. 154(b) by 0 days.

(21) Appl. No.: 10/540,824

(22) PCT Filed: Dec. 17, 2003

(86) PCT No.: PCT/EP03/51032

§ 371 (c)(1),
(2), (4) Date: Jun. 23, 2005

(87) PCT Pub. No.: WO2004/062102

PCT Pub. Date: Jul. 22, 2004

(65) Prior Publication Data

US 2006/0087368 A1    Apr. 27, 2006

(30) Foreign Application Priority Data

Jan. 6, 2003    (FR) .................................... 0300157

(51) Int. Cl.
*H03K 5/00* (2006.01)

(52) U.S. Cl. ....................................... 327/557; 327/552

(58) Field of Classification Search ......... 327/552–559; 331/74; 455/76, 84
See application file for complete search history.

(56) References Cited

U.S. PATENT DOCUMENTS

| 4,174,489 A | * | 11/1979 | Guidoux et al. ............. 375/332 |
| 4,310,803 A | | 1/1982 | Kurihara et al. |
| 4,860,321 A | * | 8/1989 | von der Embse ............ 375/343 |
| 5,097,221 A | | 3/1992 | Miller |
| 5,844,939 A | | 12/1998 | Scherer et al. |
| 2002/0044021 A1 | * | 4/2002 | Van Der Woude et al. .... 331/74 |

FOREIGN PATENT DOCUMENTS

GB    2282286    3/1995

OTHER PUBLICATIONS

Copy of Search Report dated May 7, 2004.

* cited by examiner

*Primary Examiner*—Dinh T. Le
(74) *Attorney, Agent, or Firm*—Joseph J. Laks; Robert D. Shedd; Brian J. Cromarty

(57) ABSTRACT

The invention proposes a filtering device having a frequency response which is symmetrical, using asymmetrical filters coupled by transposition means. The advantageous characteristics of the asymmetrical filters are retained and the faults associated with the asymmetry are eliminated. The asymmetrical filters are, for example, quartz filters. The invention also proposes an external transmission and reception unit, using the filtering device with the application of the filtering method.

3 Claims, 2 Drawing Sheets

HIGHLY SELECTIVE FILTERING DEVICE AND CORRESPONDING FILTERING METHOD

This application claims the benefit, under 35 U.S.C. §365 of International Application PCT/EP03/51032, filed Dec. 1, 2003, which was published in accordance with PCT Article 21(2) on Jul. 22, 2004 in English and which claims the benefit of French patent application No. 0300157, filed Jan. 6, 2003.

BACKGROUND OF THE INVENTION

1. Field of the Invention

The invention relates to a highly selective filtering device for use particularly in transmission systems, and also to the filtering method used.

2. Background Information

Figure 1:
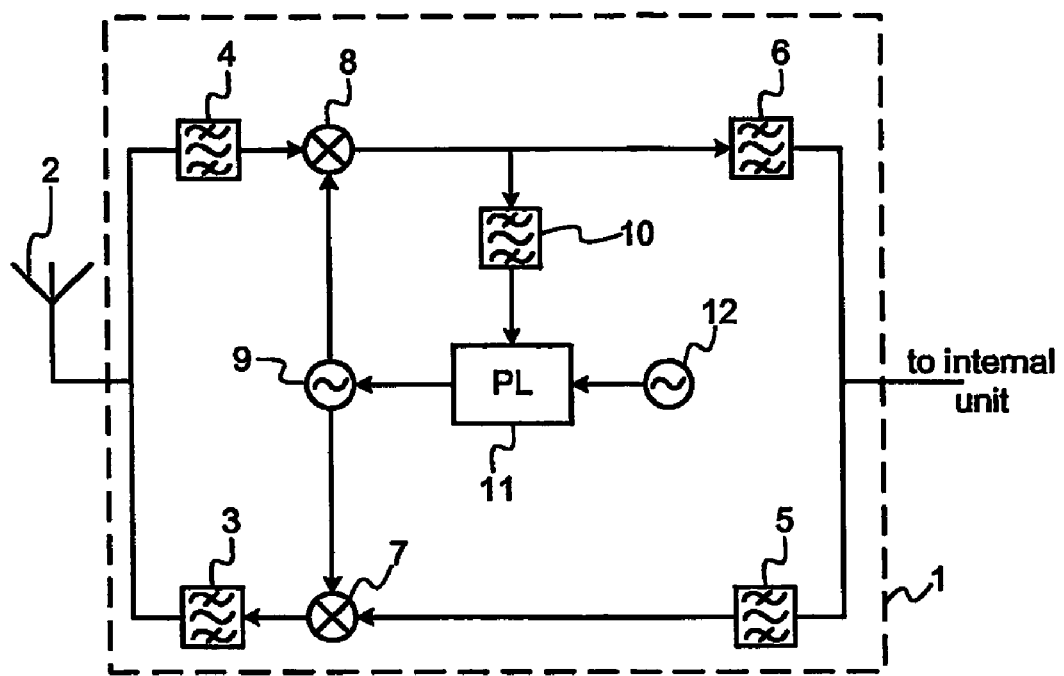

Transmission systems use very many types of filters. By way of example, FIG. 1 shows an example of an external unit 1 connected between an antenna 2 and an internal unit (not shown) such as a satellite decoder with a return channel or a decoder for a high-speed point-multi point transmission system. The external unit 1 is of a type which requires high precision in its local oscillator 9, as described for example in U.S. Pat. No. 5,844,939. Two bandpass filters 3 and 4 are used to separate the transmission and reception bands. Two other bandpass filters 5 and 6 are used to separate the intermediate transmission and reception bands. Two mixers 7 and 8 and an oscillator 9 carry out frequency transpositions between the transmission and reception bands and the intermediate transmission and reception bands. To provide high precision in the frequency of the oscillator 9, the latter is locked to a reference carrier with a highly stable frequency by means of a phase-locked loop which additionally comprises a filter 10 which selects the intermediate band reference carrier, a phase comparator 11 and a precise reference oscillator 12. A person skilled in the art can find further details of this external unit in U.S. Pat. No. 5,844,939.

SUMMARY OF THE INVENTION

An advantage of this system is that the oscillator 9 is synchronized with the oscillator of a base station, making it possible to obtain a high relative precision between the transmission and reception frequencies. However, with this type of locking, the phase noise of the oscillator 9 depends on the pass band of the filter 10. If a very low phase noise is desired, it is necessary to have a highly selective filter.

Figure 2:
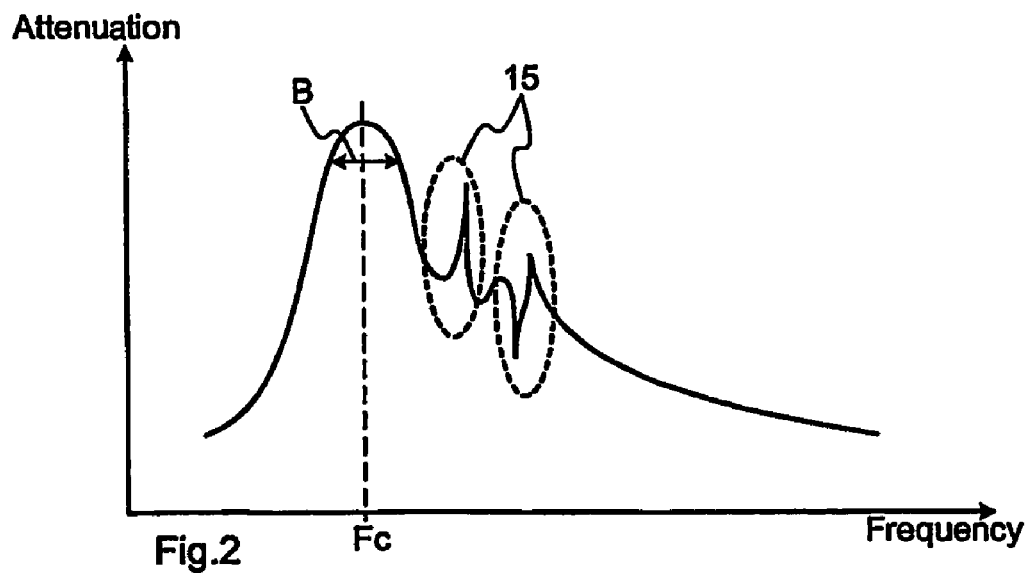

The highly selective filters which are known to have been used include quartz filters consisting of coupled resonators which have a high quality coefficient, of the order of 10,000 to 50,000 for example. An example of a frequency response of a quartz filter is shown in FIG. 2. Quartz filters have a narrow band B of the order of ten kHz for a central frequency Fc of the order of 100 MHz, while having very good temperature resistance.

However, quartz filters have an asymmetrical frequency response. The low frequency rejection is very good. For high frequencies, however, the rejection is degraded by parasitic resonances 15. These parasitic resonances depend on the geometry and cross section of the quartz used in the filter and are very difficult to control during the manufacture of the filters.

One object of the invention is to provide a filtering device having a frequency response which is symmetrical, while retaining the advantages of an asymmetric bandpass filter such as a quartz filter.

The invention is therefore a filtering device having a first bandpass filter with a given central frequency and a given bandwidth, a second bandpass filter identical to the first bandpass filter, and frequency transposition means, connected between the first filter and the second filter, which transpose the central frequency of the first filter to the same central frequency while inverting the spectrum around the central frequency.

Preferably, the transposition means comprise a mixer having two inputs and one output, one of the inputs being connected to an output of the first bandpass filter and the output being connected to an input of the second bandpass filter, and an oscillator having an output connected to the other input of the mixer, the oscillator supplying a signal at a frequency equal to twice the central frequency of the first and second bandpass filters.

To provide a filtering device with a very narrow band, the first and second filters are quartz filters.

The invention is also an external unit of a signal transmission and reception device, comprising an adjustable oscillator, which is locked to a received carrier frequency, and a filtering device as defined above which is connected in the locking loop of the adjustable oscillator.

In another aspect, the invention is a method for the selective filtering of a signal in which a first selective filtering is carried out in a given frequency band, the said band having a central frequency, by means of a first asymmetric filter, to provide a first filtered signal; the first filtered signal is transposed to place an image corresponding to the given frequency band in the same band but with an inverted spectrum with respect to the central frequency; and a second selective filtering is carried out in the given frequency band, by means of a second asymmetric filter, to provide a second filtered signal, the second filter being identical to the first filter.

Preferably, the transposition is carried out by a mixer which receives a transposition signal whose frequency is twice the central frequency of the filters.

The invention will be more clearly understood and other characteristics and advantages will become evident when the following description is read, this description making reference to the attached drawings, in which:

BRIEF DESCRIPTION OF THE

Figure 3:
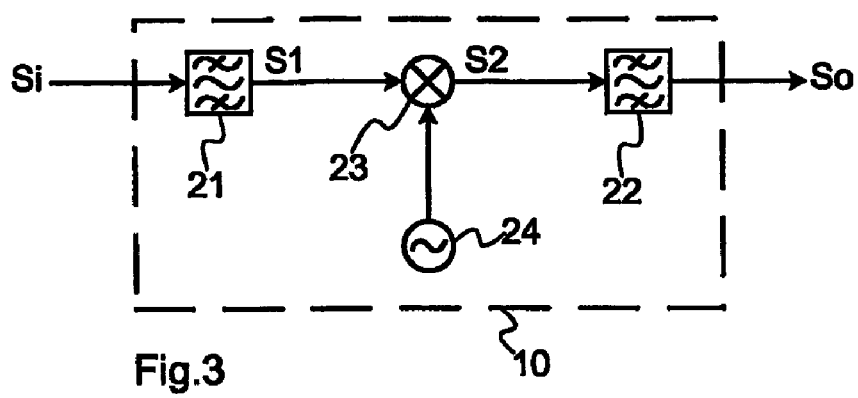
Figure 4:
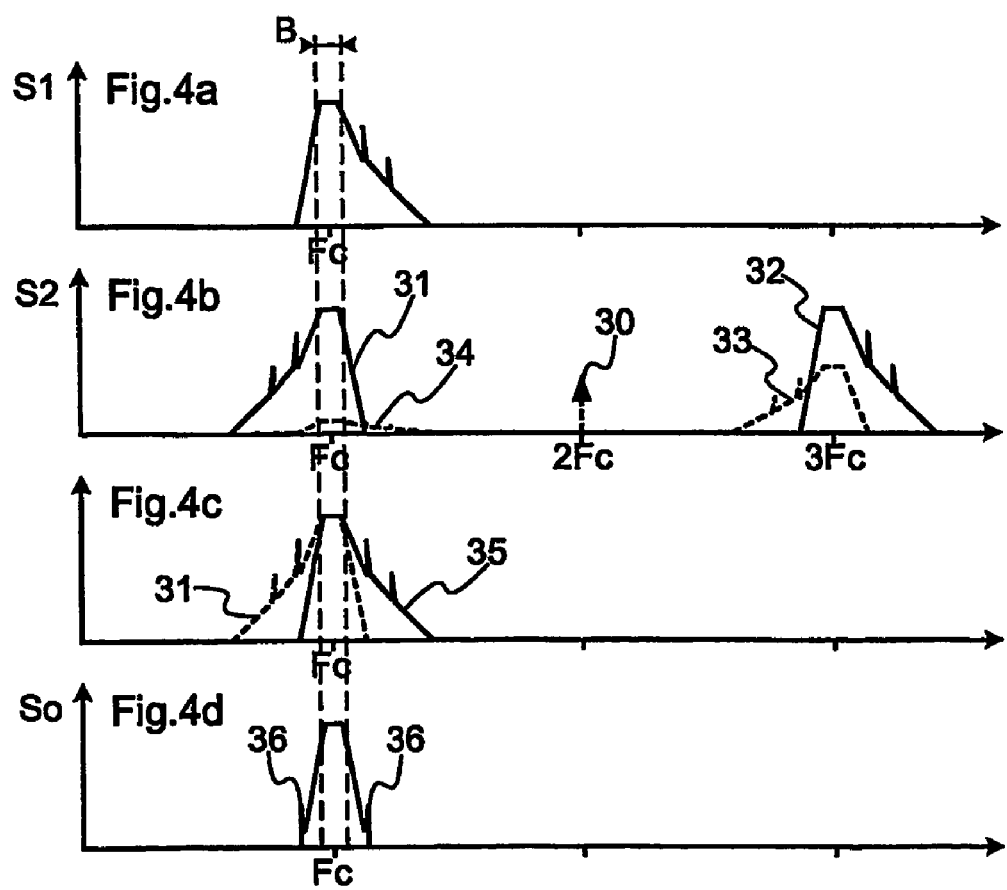

FIG. 1 shows an external unit of a transmission and reception device using an oscillator locked to a received carrier frequency, FIG. 2 shows a response curve of a quartz filter, FIG. 3 shows a filtering device according to the invention, FIG. 4 shows the operation of the filtering device of FIG. 3.

Since FIGS. 1 and 2 have been described already, they will not be described in greater detail.

DESCRIPTION OF THE PREFERRED EMBODIMENTS

In order to improve the external unit of FIG. 1, the use of a filtering device 10 as illustrated in FIG. 3 is proposed. The filtering device 10 comprises a first filter 21 and a second filter 22 interconnected by frequency transposition means. The first and second filters are bandpass filters whose frequency response is asymmetrical. To obtain a highly selective filtering device, the first and second filters are quartz filters whose frequency response corresponds to that shown in FIG. 2, each filter having a pass band B centred on a central frequency Fc. The input of the first filter 21 corresponds to the input of the filtering device 10 and the output of the second filter 22 corresponds to the output of the filtering device 10.

The transposition means comprise a mixer 23 and an oscillator 24. A first input of the mixer 23 is connected to the output of the first filter 21. A second input of the mixer 23 is connected to an output of the oscillator 24. An output of the mixer 23 is connected to the input of the second filter 22,. The oscillator 24 supplies at its output a signal whose frequency is equal to twice the central frequency Fc.

The operation of the filtering device 10 of FIG. 3 will now be explained with reference to FIG. 4. We shall assume that the input signal Si of the filtering device is a white noise whose frequency spectrum is equal to a constant, regardless of the frequency. At the output of the first filter 21, the resulting signal S1 corresponds to the envelope of the first filter 21, as shown in FIG. 4a. FIG. 4a shows in a schematic and less detailed way the same envelope as FIG. 2.

FIG. 4b shows the signal S2 corresponding to the output of the mixer 23. The oscillator 24 supplies a signal equal to twice the frequency Fc. A radiation line 30 corresponding to this oscillator frequency is present and corresponds to a leak from the mixer 23. A first image 31 of rank 1 is present, with an inverted spectrum around the frequency Fc. A second image 32 of rank 1 is present around the frequency 3*Fc. A third image 33 of rank 2 is also present with an inverted spectrum around the frequency 3*Fc. Other images, not shown, are also present at frequencies which are odd-numbered multiples of the frequency Fc, with different attenuations, depending on the rank of the image, as will be familiar to those skilled in the art. A residual image 34 is also present around the frequency Fc. However, the residual image 34 corresponds to an isolation fault of the mixer 23 between the input of the signal for transposition and its output. As is known by those skilled in the art, many mixers have an isolation of the order of 40 dB between the input and output of the signal, making the residual image negligible with respect to the first image 31 of rank 1.

FIG. 4c shows the superimposition of the first image 31 on the envelope 35 of the second filter 22, showing how they are positioned with respect to each other.

FIG. 4d shows the output signal So corresponding to the signal leaving the second filter 22. Since the input signal Si is a white noise, the signal So also corresponds to the envelope of the filtering device 10. As FIG. 4d shows, the pass band is very narrow and symmetrical. There are still some parasitic resonances 36, but these are greatly attenuated and no longer create significant undesirable perturbation.

A person skilled in the art will understand that a filtering device of this kind can be adapted to any type of filter having an asymmetrical frequency response, and is not limited to quartz filters.

Different transposition means can also be used. The preferred example shows a simple arrangement which requires the use of a mixer with low leakage. However, it is possible to use other transposition means, for example by combining two mixers in order to reduce the constraints on mixer leakage.

The invention claimed is:

1. Symmetrical filtering device comprising:
    a first asymmetrical bandpass filter having a given central frequency and a given bandwidth,
    a second asymmetrical bandpass filter identical to the first asymmetrical bandpass filter, and
    frequency transposition means, connected between the first asymmetrical filter and the second asymmetrical filter, which transpose the central frequency of the first filter to the same central frequency while inverting a spectrum around the central frequency.

2. Device according to claim 1, wherein the first and second bandpass filters are quartz filters.

3. Method for providing a symmetrical frequency response with asymmetrical filters, wherein:
    collectively filtering a signal in a given frequency band, having a central frequency, by means of a first asymmetrical filter, to obtain a first filtered signal,
    transposing the first filtered signal to place an image corresponding to the given frequency band in the same band but with an inverted spectrum with respect to the central frequency, and
    selectively filtering the transposed signal in the given frequency band, by means of a second asymmetrical filter, to obtain a second filtered signal, the second filter being identical to the first filter.

* * * * *